United States Patent
Zhang et al.

(10) Patent No.: US 11,949,430 B2
(45) Date of Patent: Apr. 2, 2024

(54) PARALLEL SYSTEM TO CALCULATE LOW DENSITY PARITY CHECK

(71) Applicant: SK hynix Inc., Gyeonggi-do (KR)

(72) Inventors: Fan Zhang, Fremont, CA (US); Haobo Wang, San Jose, CA (US); Hongwei Duan, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/901,126

(22) Filed: Sep. 1, 2022

(65) Prior Publication Data

US 2024/0080046 A1 Mar. 7, 2024

(51) Int. Cl.
*H03M 13/00* (2006.01)
*H03M 13/09* (2006.01)
*H03M 13/11* (2006.01)
*H03M 13/15* (2006.01)

(52) U.S. Cl.
CPC ....... *H03M 13/116* (2013.01); *H03M 13/098* (2013.01); *H03M 13/1575* (2013.01)

(58) Field of Classification Search
CPC .......... H03M 13/116; H03M 13/1157; H03M 13/098; H03M 13/1575; H03M 13/255
See application file for complete search history.

(56) References Cited

U.S. PATENT DOCUMENTS

| | | | |
|---|---|---|---|
| 8,127,209 B1* | 2/2012 | Zhang | H03M 13/036 714/780 |
| 8,276,055 B1 | 9/2012 | Gunnam et al. | |
| 8,929,009 B2* | 1/2015 | Yang | G11B 20/1833 360/39 |
| 8,996,969 B2* | 3/2015 | Bolotov | H03M 13/1142 714/752 |
| 9,473,173 B2* | 10/2016 | Yen | H03M 13/2906 |
| 10,128,869 B2* | 11/2018 | Tate | H03M 13/1128 |
| 10,523,236 B2* | 12/2019 | Kuo | H03M 13/1128 |
| 10,651,872 B2* | 5/2020 | Savin | H04L 1/0057 |

* cited by examiner

*Primary Examiner* — Esaw T Abraham
(74) *Attorney, Agent, or Firm* — IP & T GROUP LLP

(57) ABSTRACT

An LDPC encoding method and a system for error code detection. In the method and system, partial syndromes using a user portion and a low density parity check matrix are calculated, a parity portion of a codeword is calculated using the partial syndromes and using a quasi-cyclic matrix, the parity portion is generated by segment processing of the quasi-cyclic matrix, and the user portion and the parity portion are concatenated to complete the codeword.

20 Claims, 12 Drawing Sheets

PARALLEL SYSTEM TO CALCULATE LOW DENSITY PARITY CHECK

BACKGROUND

1. Field

Embodiments of the present disclosure relate to a scheme for calculating a parity code for data being transmitted and written to a memory storage device.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

In general, memory systems using memory devices provide excellent stability, durability, high information access speed, and low power consumption, since the memory devices have no moving parts. Examples of memory systems having such advantages include universal serial bus (USB) memory devices, memory cards having various interfaces such as a universal flash storage (UFS), and solid state drives (SSDs). Data integrity is important for data storage devices and data transmission. In solid state memory storage (such as NAND flash) devices, information is stored in a cell by different charge levels in a cell. During the write and read processes, noise is introduced by program disturb errors and inter-cell interference charge leakage that cause the voltage distribution and level to drop over time. Generating accurate read voltages improves the reliability and longevity of the memory storage devices.

As the size of memory systems increase, it becomes more important to be able to transmit data to and from the memory cells despite the increased noise and to verify that the data transmitted was accurately received.

SUMMARY

Aspects of the present invention include a method and a system for encoding data to be written to a storage device.

In one aspect, there is provided an LDPC encoding method comprising: calculating partial syndromes using a user portion and a low density parity check matrix, calculating a parity portion of a codeword using the partial syndromes and using a quasi-cyclic matrix, generating by segment processing of the quasi-cyclic matrix the parity portion, and concatenating the user portion and the parity portion to complete the codeword.

In another aspect, there is provided a system for error code detection and correction. The system includes a data source and a controller configured to perform LDPC encoding of data bit information from the data source. The controller is programmed to: calculate partial syndromes using a user portion and a low density parity check matrix, calculate a parity portion of a codeword using the partial syndromes and using a quasi-cyclic matrix, generate by segment processing of the quasi-cyclic matrix the parity portion, and concatenate the user portion and the parity portion to complete the codeword.

Additional aspects of the present invention will become apparent from the following description.

DETAILED DESCRIPTION

Figure 1:
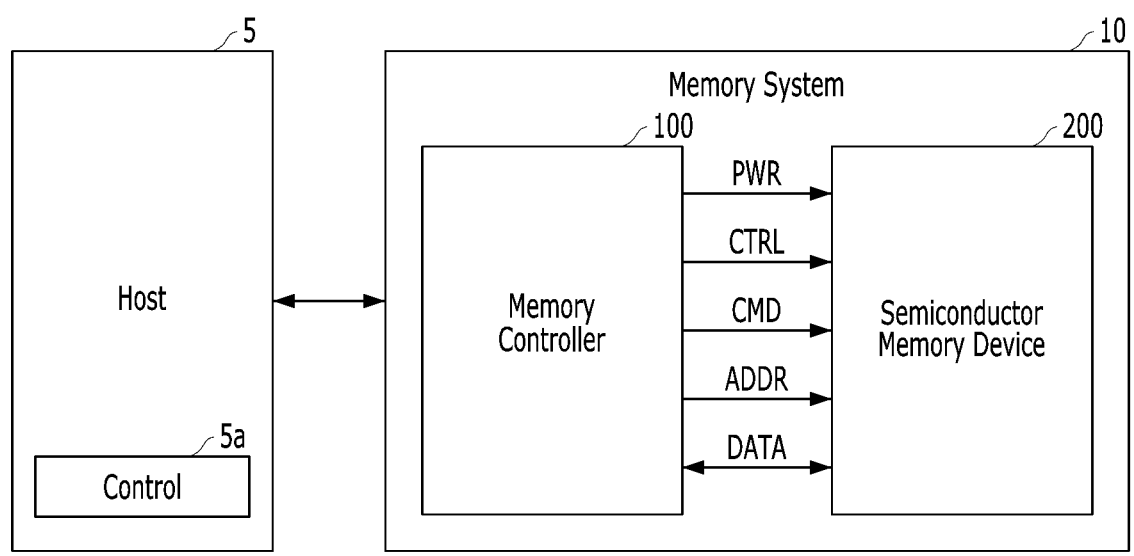
FIG. 1 is a block diagram illustrating a data processing system.

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure conveys the scope of the present invention to those skilled in the art. Moreover, reference herein to "an embodiment," "another embodiment," or the like is not necessarily to only one embodiment, and different references to any such phrase are not necessarily to the same embodiment(s). The term "embodiments" as used herein does not necessarily refer to all embodiments. Throughout the disclosure, like reference numerals refer to like parts in the figures and embodiments of the present invention.

The present invention can be implemented in numerous ways, for example including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the present invention may take, may be referred to as techniques. In general, the order of the operations of disclosed processes may be altered within the scope of the present invention. Unless stated otherwise, a component such as a processor or a memory described as being suitable for performing a task may be implemented as a general device or circuit component that is configured or otherwise programmed to perform the task at a given time or as a specific device or as a circuit component that is manufactured or pre-configured or pre-programmed to perform the task. As used herein, the term 'processor' or the like refers to one or more devices, circuits, and/or processing cores suitable for processing data, such as computer program instructions.

The methods, processes, and/or operations described herein may be performed by code or instructions to be executed for example by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described herein, the code or instructions for implementing the operations of the method embodiments may transform the computer, processor, controller, or other signal processing device into a special-purpose processor for performing any one of the methods herein.

If implemented at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

A detailed description of various embodiments of the present invention is provided below along with accompanying figures that illustrate aspects of the present invention. The present invention is described in connection with such embodiments, but the present invention is not limited to any specific embodiment. The present invention encompasses numerous alternatives, modifications and equivalents. Numerous specific details are set forth in the following description in order to provide a thorough understanding of the present invention. These details are provided for the purpose of example; the present invention may be practiced without some or all of these specific details. For clarity, technical material that is known in technical fields related to the present invention has not been described in detail so that the invention is not unnecessarily obscured.

Semiconductor memory devices may be volatile or nonvolatile. The volatile semiconductor memory devices perform read and write operations at high speeds, while contents stored therein may be lost at power-off. The nonvolatile semiconductor memory devices may retain contents stored therein even at power-off. The nonvolatile semiconductor memory devices may be used to store contents, which must be retained regardless of whether they are powered.

With an increase in a need for a large-capacity memory device, a multi-level cell (MLC) or multi-bit memory device storing multi-bit data per cell is becoming more common. However, memory cells in an MLC non-volatile memory device must have threshold voltages corresponding to four or more discriminable data states in a limited voltage window. For improvement of data integrity in non-volatile memory devices, the levels and distributions of read voltages for discriminating the data states may be adjusted over the lifetime of the memory device to have optimal values during read operations and/or read attempts.

FIG. 1 is a block diagram illustrating a data processing system 2 in accordance with one embodiment of the present invention.

Referring FIG. 1, the data processing system 2 may include a host device 5 and a memory system 10. The memory system may receive a request from the host device 5 and operate in response to the received request. For example, the memory system may store data to be accessed by the host device 5.

The host device 5 may be implemented with any of various types of electronic devices. In various embodiments, the host device 5 may be an electronic device such as for example a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may be a portable electronic device such as for example a mobile phone, a smart phone, an e-book, an MP3 player, a portable multimedia player (PMP), and/or a portable game player.

The memory system 10 may be implemented with any of various types of storage devices such as a solid state drive (SSD) and a memory card. In various embodiments, the memory system 10 may be provided as one of various components in an electronic device such as for example a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive through input/output lines a command CMD, an address ADDR and data DATA. The semiconductor memory device 200 may receive power PWR through a power line and a control signal CTRL through a control line. The control signal CTRL may include for example a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. In one embodiment of the invention, where the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
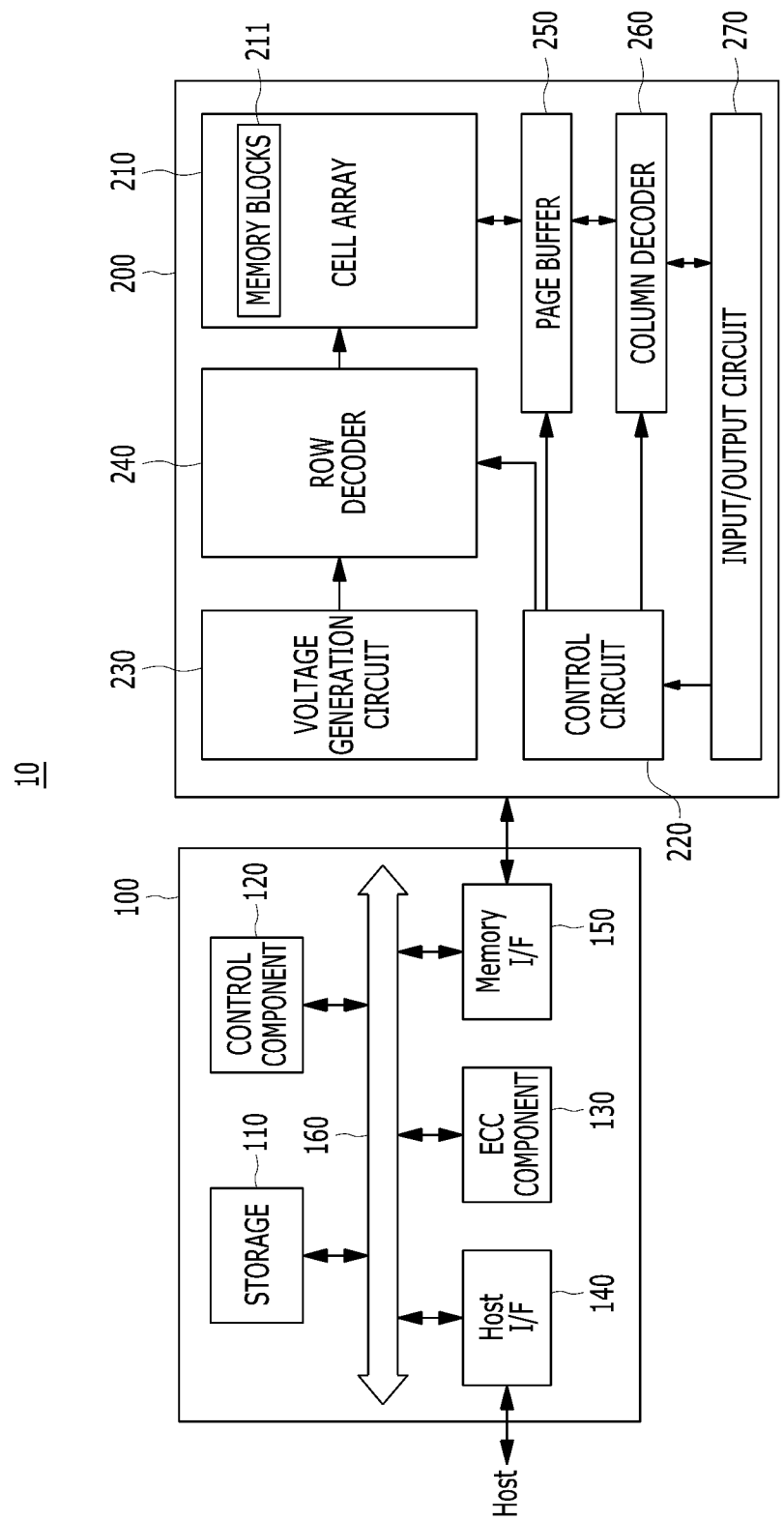
FIG. 2 is a block diagram illustrating a memory system.

FIG. 2 is a block diagram illustrating a memory system in accordance with one embodiment of the present invention. For example, the memory system of FIG. 2 may depict the memory system shown in FIG. 1.

Referring to FIG. 2, the memory system 10 may include a memory controller 100 and a semiconductor memory device 200. The memory system 10 may operate in response to a request from a host device (e.g., a request from host device 5 of FIG. 1), and in particular, store data to be accessed by the host device.

The memory device 200 may store data to be accessed by the host device.

The memory device 200 may be implemented with a volatile memory device such as for example a dynamic random access memory (DRAM) and/or a static random access memory (SRAM) or a non-volatile memory device such as for example a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as for example a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and storage 110 may store data for driving the memory system 10 and the controller 100 and may store data for encoding and/or decoding the data bit information being transmitted/received. For example, when the controller 100 controls operations of the memory device 200, the storage 110 may store data used by the controller 100 and the memory device 200 for such operations as read, write, program and erase operations including encoding and decoding.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware or other program instructions, which can be referred to as a flash translation layer (FTL), to control operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. In one embodiment, the ECC component 130 may not correct error bits when the number of the error bits is greater than or equal to a threshold number of correctable error bits, but instead may output an error correction fail signal indicating failure in correcting the error bits.

In various embodiments, the ECC component 130 may perform an error correction operation based on a coded modulation such as for example a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). While error correction in the present invention is not limited to these techniques, the teachings below for a LDPC method for encoding/decoding data are especially suitable for the reasons given below. As such, the ECC component 130 may include any and all circuits, systems or devices suitable for error correction operation.

The host interface 140 may communicate with the host device through one or more of various communication standards or interfaces such as for example a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. In one embodiment where the memory device 200 is a flash memory such as a NAND flash memory, the memory interface 150 may generate control signals for the memory and process data under the control of the control component 120.

The memory device 200 as shown for example in FIG. 2 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform program, read, or erase operations of the memory cell array 210. The control circuit 220 may control the peripheral circuit.

The voltage generation circuit 230 may generate operational voltages of various levels. For example, in an erase operation, the voltage generation circuit 230 may generate operational voltages of various levels such as for example an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
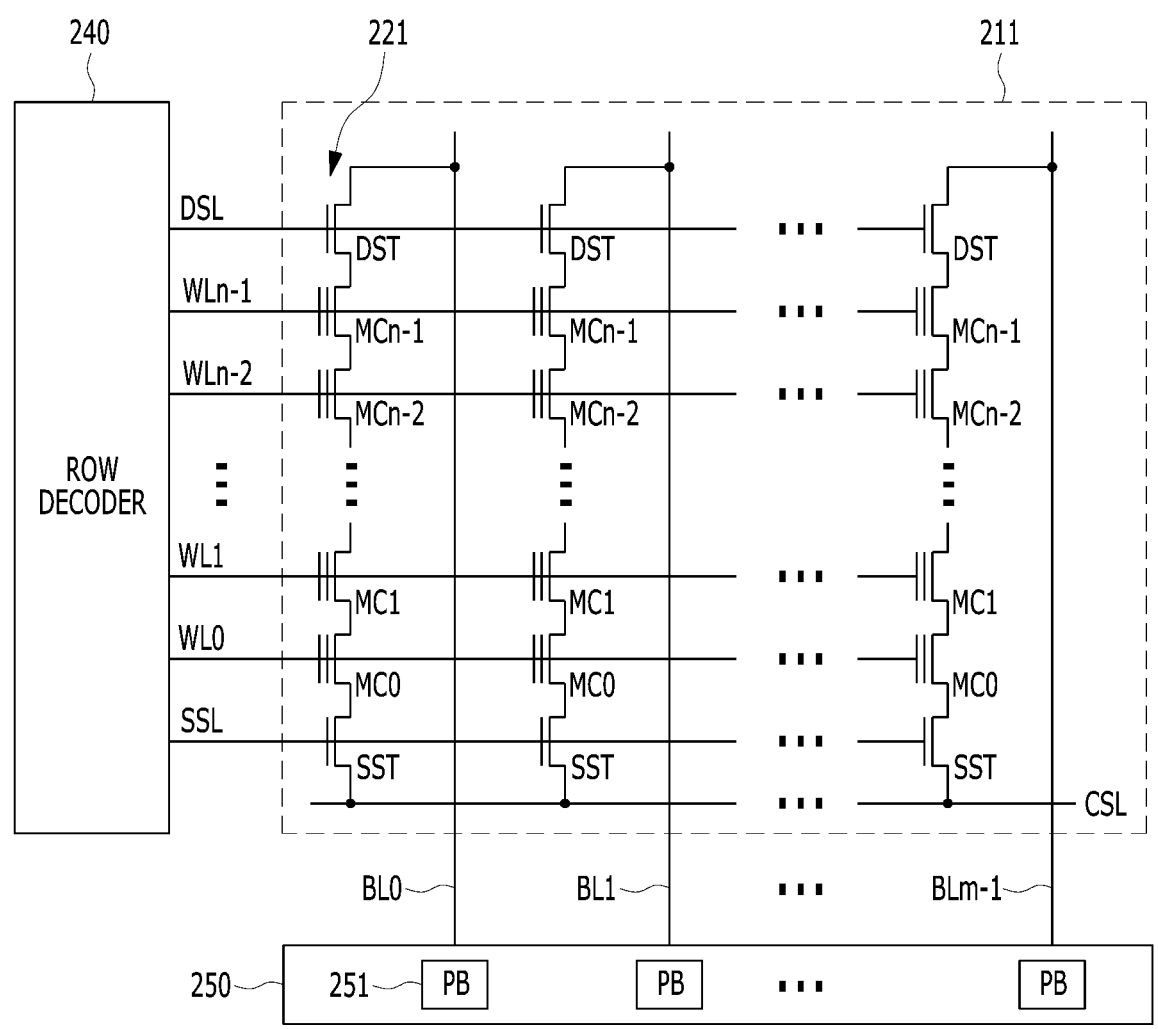
FIG. 3 is a circuit diagram illustrating a memory block of a memory device.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or may transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device.

The control circuit 220 may control the peripheral circuit in response to the command and the address.

FIG. 3 is a circuit diagram illustrating a memory block of a semiconductor memory device in accordance with one embodiment of the present invention. For example, the memory block of FIG. 3 may be any of the memory blocks 211 of the memory cell array 210 shown in FIG. 2.

Referring to FIG. 3, the memory block 211 may include a plurality of word lines WL0 to WLn−1, a drain select line DSL and a source select line SSL coupled to the row decoder 240. These lines may be arranged in parallel, with the plurality of word lines between the DSL and SSL.

The memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 my temporarily store data received through the bit lines BL0 to BLm−1 or sense voltages or currents of the bit lines during a read or verify operation.

In various embodiments of the present invention, the memory blocks 211 may include a NAND-type flash memory cell. However, the memory blocks 211 are not limited to such cell type, and may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
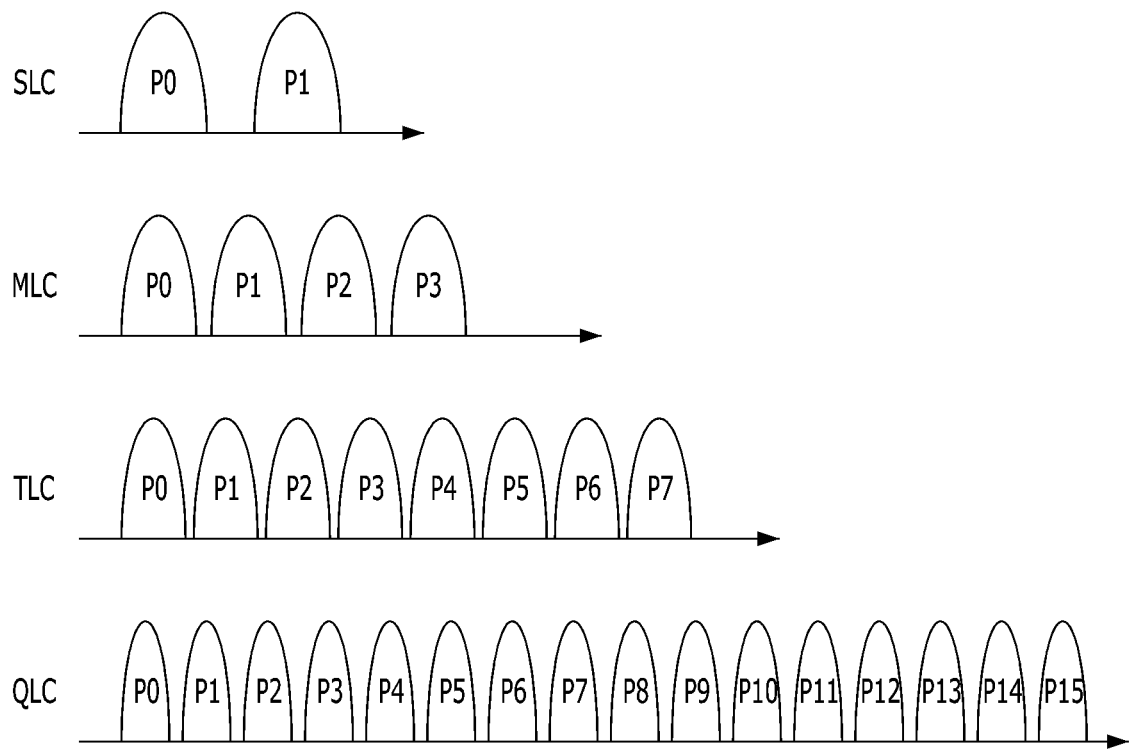
FIG. 4 is a diagram illustrating distributions of states for different types of cells of a memory device.

FIG. 4 is a diagram illustrating distributions of states or program voltage (PV) levels for different types of cells of a memory device.

Referring to FIG. 4, each of memory cells may be implemented with a specific type of cell, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data. Usually, all memory cells in a particular memory device are of the same type, but that is not a requirement.

An SLC may include two states P0 and P1. P0 may indicate an erase state, and P1 may indicate a program state. Since the SLC can be set in one of two different states, each SLC may program or store 1 bit according to a set coding method. An MLC may include four states P0, P1, P2 and P3. Among these states, P0 may indicate an erase state, and P1 to P3 may indicate program states. Since the MLC can be set in one of four different states, each MLC may program or store two bits according to a set coding method. A TLC may include eight states P0 to P7. Among these states, P0 may indicate an erase state, and P1 to P7 may indicate program states. Since the TLC can be set in one of eight different states, each TLC may program or store three bits according to a set coding method. A QLC may include 16 states P0 to P15. Among these states, P0 may indicate an erase state, and P1 to P15 may indicate program states. Since the QLC can be set in one of sixteen different states, each QLC may program or store four bits according to a set coding method.

Referring back to FIGS. 2 and 3, the memory device 200 may include a plurality of memory cells (e.g., NAND flash memory cells). The memory cells are arranged in an array of rows and columns as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is addressed. During a read operation, the word line is again addressed, and the threshold voltage of each cell can then be acquired from the bit line. Multiple pages may share the memory cells that belong to (i.e., are coupled to) the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed for example using a coding scheme (e.g., Gray coding) in order to increase the capacity of the memory system 10 such as SSD.

Figure 5A:
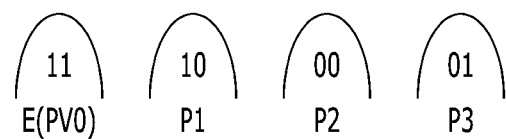
FIG. 5A is a diagram illustrating an example of Gray coding for a multi-level cell (MLC).

FIG. 5A is a diagram illustrating an example of coding for a multi-level cell (MLC).

Referring to FIG. 5A, an MLC may be programmed using a set type of coding. An MLC may have 4 program states, which include an erased state E (or PV0) and a first program state PV1 to a third program state PV3. The erased state E (or PV0) may correspond to "11." The first program state PV1 may correspond to "10." The second program state PV2 may correspond to "00." The third program state PV3 may correspond to "01."

Figure 5B:
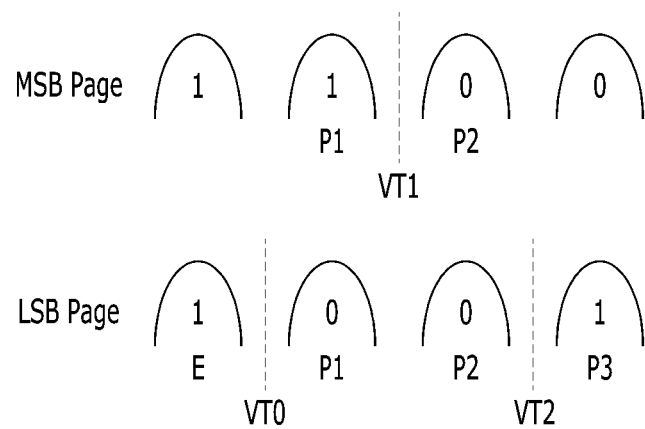
FIG. 5B is a diagram illustrating state distributions for pages of a multi-level cell (MLC).

In the MLC, as shown in FIG. 5B, there are 2 types of pages including LSB and MSB pages. 1 or 2 thresholds may be applied in order to retrieve data from the MLC. For an MSB page, the single threshold value is VT1. VT1 distinguishes between the first program state PV1 and the second program state PV2. For an LSB page, 2 thresholds include a threshold value VT0 and a threshold value VT2. VT0 distinguishes between the erased state E and the first program state PV1. VT2 distinguishes between the second program state PV2 and the third program state PV3.

Figure 6A:
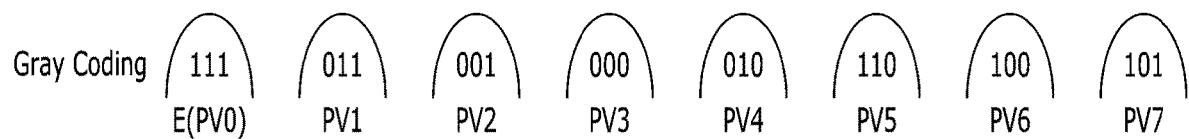
FIG. 6A is a diagram illustrating one example of Gray coding for a triple-level cell (TLC).

FIG. 6A is a diagram illustrating an example of Gray coding for a triple-level cell (TLC).

Referring to FIG. 6A, a TLC may be programmed using Gray coding. A TLC may have 8 program states, which include an erased state E (or PV0) and a first program state PV1 to a seventh program state PV7. The erased state E (or PV0) may correspond to "111." The first program state PV1 may correspond to "011." The second program state PV2 may correspond to "001." The third program state PV3 may correspond to "000." The fourth program state PV4 may correspond to "010." The fifth program state PV5 may correspond to "110." The sixth program state PV6 may correspond to "100." The seventh program state PV7 may correspond to "101."

Figure 6B:
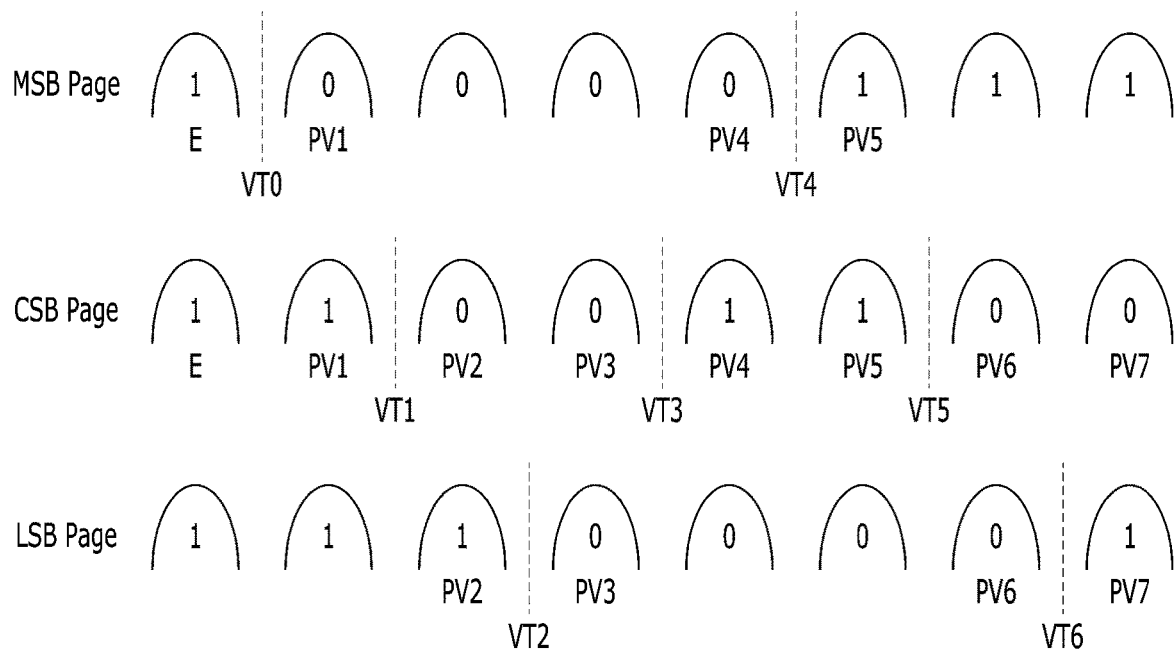
FIG. 6B is a diagram illustrating state distributions for pages of a triple-level cell (TLC).

In the TLC, as shown in FIG. 6B, there are 3 types of pages including LSB, CSB and MSB pages. 2 or 3 thresholds may be applied in order to retrieve data from the TLC. For an MSB page, 2 thresholds include a threshold value VT0 that distinguishes between an erase state E and a first program state PV1 and a threshold value VT4 that distinguishes between a fourth program state PV4 and a fifth program state PV5. For a CSB page, 3 thresholds include VT1, VT3 and VT5. VT1 distinguishes between a first program state PV1 and a second program state PV2. VT3 distinguishes between a third program state PV3 and the fourth program state PV4. VT5 distinguishes between the fourth program state PV5 and the sixth program state PV6. For an LSB page, 2 thresholds include VT2 and VT6. VT2 distinguishes between the second program state PV2 and the third program state PV3. VT6 distinguishes between the sixth program state PV6 and a seventh program state PV7.

After a memory array including a plurality of memory cells is programmed as described in FIGS. 5A and 6A, when a read operation is performed on the memory array using a reference voltage such as a read threshold voltage (also called "read voltage level" or "read threshold"), the electrical charge levels of the memory cells (e.g., threshold voltage levels of transistors of memory cells) are compared to one or more reference voltages to determine the state of individual memory cells. When a specific read threshold is applied to the memory array, those memory cells that have threshold voltage levels higher than the reference voltage are turned on and detected as "on" cell, whereas those memory cells that have threshold voltage levels lower than the reference voltage are turned off and detected as "off" cell, for example. Therefore, each read threshold is arranged between neighboring threshold voltage distribution windows corresponding to different programmed states so that each read threshold can distinguish such programmed states by turning on or off the memory cell transistors.

When a read operation is performed on memory cells in a data storage device using MLC technology, the threshold voltage levels of the memory cells are compared to more than one read threshold level to determine the state of individual memory cells. Read errors can be caused by distorted or overlapped threshold voltage distributions. An ideal memory cell threshold voltage distribution can be significantly distorted or overlapped due to, e.g., program and erase (P/E) cycles, cell-to-cell interference, and/or data retention errors. For example, as program/erase cycles increase, the margin between neighboring threshold voltage distributions of different programmed states decreases and eventually the distributions overlap. As a result, the memory cells with threshold voltages that fall within the overlapping region of the neighboring distributions may be read as being programmed to a value other than the original targeted value and thus cause read errors. Such read errors may be managed in many situations by using error correction codes (ECC). When the number of bit errors on a read operation exceeds the ECC correction capability of the data storage, the read operation using a set read threshold voltage fails. The set read threshold voltage may be a previously used read threshold voltage (i.e., a historical read threshold voltage). The historical read threshold voltage may be the read threshold voltage used in the last successful decoding, that is, a read voltage used in a read-passed read operation performed before read retry operations. When the read operation using the set read threshold voltage failed, the controller 120 may control an error recovery algorithm such as for example the algorithm shown in FIG. 7.

Figure 7:
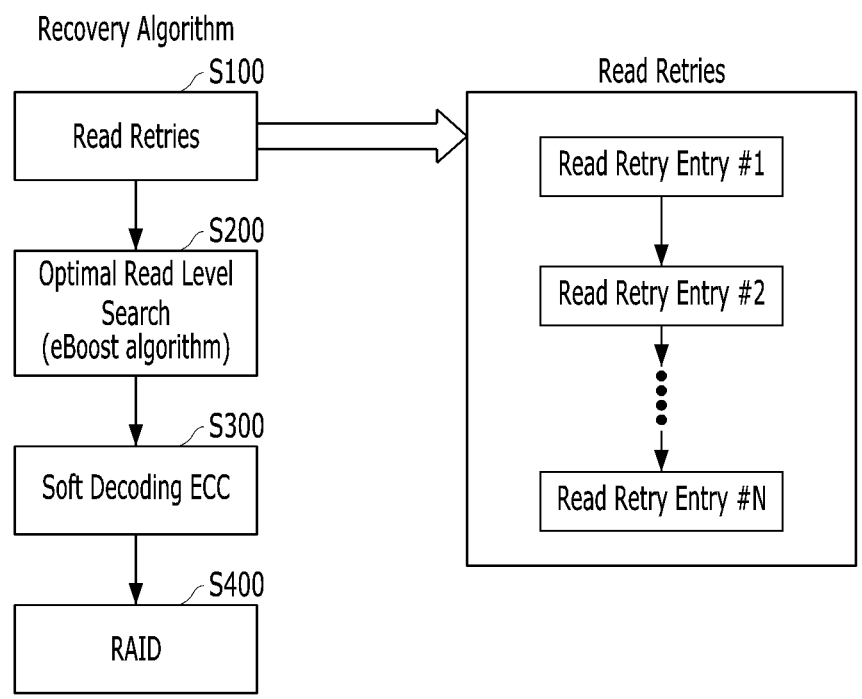
FIG. 7 is a diagram illustrating a flow of an error recovery algorithm in a memory system.

Referring to FIG. 7, the controller 120 may perform one or more read retry operations for the memory cells using one or more read threshold voltages applied in a set order (S100). For example, the read threshold voltages may include N (e.g., N is 5 or 10) read threshold voltages (or read voltage levels) including a first read threshold voltage to an Nth read threshold voltage. The first read threshold voltage may be a previously used read threshold voltage (i.e., history read threshold voltage). The historical read threshold voltage may be the read threshold voltage used in the last successful decoding, that is, a read voltage used in a read-passed read operation performed before the read retry operations. The controller 120 may perform the read retry operations until it is determined that decoding associated with a corresponding read retry operation is successful.

When all read retry operations using the read threshold voltages have failed, the controller 120 may perform additional recovery operations. For example, the additional recovery operations may include an optimal read threshold voltage search (S200), a soft decoding using an error correction code (ECC) (S300) and/or a redundant array of independent disks (RAID) recovery (S400).

As noted above, data retrieved from a memory device (e.g., a NAND flash device) in a data storage device (e.g., a solid state drive (SSD)) usually contains many bit errors due to various noise sources. To protect the data, it is encoded by an error correction code before being written to the memory device (i.e., before being written to a storage medium). A decoder may correct all bit errors by using this error correction code. As illustrated in FIG. 7 by the "Read Retries" shown there, in one embodiment of the present invention, when the number of errors surpasses the capability of the error correction code, the data storage device may invoke a particular defense algorithm (e.g., a read retry operation) to read the storage media multiple times with better parameters than the original read operation until the data can be recovered by the error correction code. In one embodiment of the present invention, as detailed below, different read thresholds can be used to better read pages of data.

For a solid state drive, one source of increased bit errors is the use of sub-optimal read thresholds during the read operation. One method (e.g., an eBoost algorithm) to estimate an optimal read threshold performs several additional read operations with different read thresholds on the same page, and estimates the optimal read threshold that minimizes the bit errors in the retrieved data. These additional read operations may increase the latency of the read operation and may degrade a quality of service (QoS) of the data storage device (or memory system).

Figure 8:
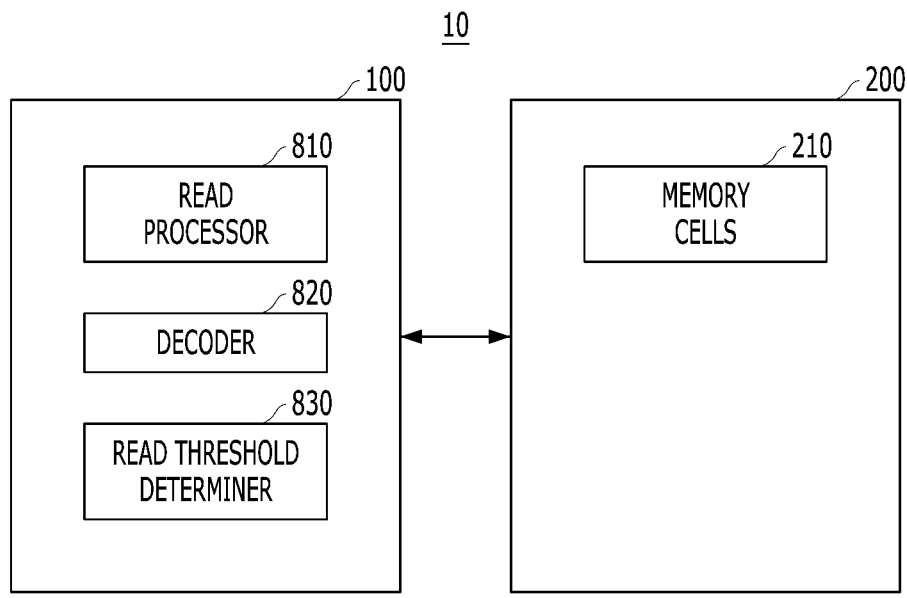
FIG. 8 is a diagram illustrating a memory system in accordance with one embodiment of the present invention.

FIG. 8 is a diagram illustrating a memory system 10 in accordance with one embodiment of the present invention.

Referring to FIG. 8, the memory system 10 may include a controller 100 and a memory device 200. The memory device 200 may include a plurality of memory cells (e.g., NAND flash memory cells) 210. The memory cells are arranged in an array of rows and columns such as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is addressed. During a read operation, the word line is again addressed, and the threshold voltage of each cell can then be acquired from the bit line. Multiple pages may share the memory cells that belong to (i.e., are coupled to) the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed using a coding scheme (e.g., Gray coding) in order to increase the capacity of the memory system 10 such as an SSD.

The controller 100 may include a read processor 810, a decoder 820 and an optimal read threshold determiner 830. Although it is illustrated that components of the controller 100 are implemented separately, these components may be implemented with an internal component (i.e., firmware (FW)) of the control component 120 in FIG. 2. The controller 100 and the memory device 200 may include various other components such as those shown in FIG. 2.

Data retrieved directly from a data storage media (e.g., NAND Flash) in a storage device (e.g. a solid-state drive, SSD) usually contains noise. To protect the data, it is encoded by an error correction code before being written to another media. The design of an encoder is important for the read/write performance of the SSD and is important for reading/writing data to other memory devices.

Similar to that described in U.S. Pat. No. 8,276,055 (the entire contents of which are incorporated herein by reference), error correcting codes (such as low-density parity check codes including those of the present invention) are often used to correct errors which may occur during transmission or storage. In general, these encoders are desirable for high-reliability digital communication or storage systems in which low-latency and low memory buffering are desired. Encoding may generally refer to the process of generating data in a manner that facilitates subsequent detection and/or correction of errors in the data, while decoding may generally refer to the counterpart process of detecting and/or correcting the errors.

Figure 9:
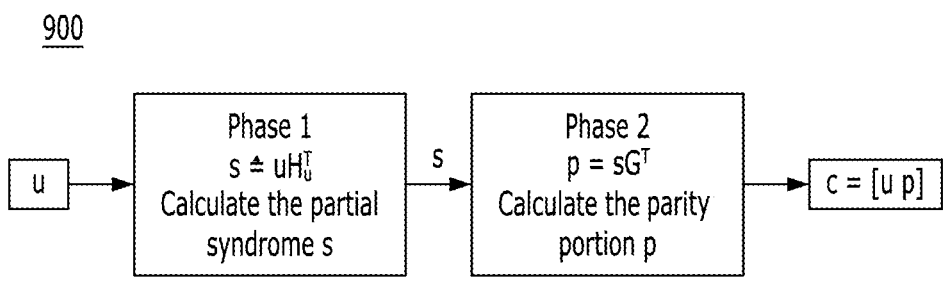
FIG. 9 is a diagram depicting an LDPC encoder 900 according to one embodiment of the present invention.

FIG. 9 is a diagram depicting an LDPC encoder 900 according to one embodiment of the present invention. As defined herein:

c is a low density parity check (LDPC) codeword, u is the user portion (or the data portion containing bit information) of the LDPC codeword, and p is the parity portion of the LDPC codeword, where c, u, and p may be represented as matrices; and H is a LDPC parity check matrix.

In theory,

1) $c \cdot H^T = 0$ Meaning any codeword should satisfy all parity check equations of the LDPC code.

2) $[u\ p] \times [H_u\ H_p]^T = 0$ If the LDPC code is systematic, the user portion and parity portion of both the codeword and the parity check matrix can be split accordingly.

3) $uH_u^T + pH_p^T = 0$

4) $p = uH_u^T \times (H_p^T)^{-1}$ $$s \triangleq uH_u^T$$

Define s as partial syndrome from the user portion.

6) $p = s \times (H_p^T)^{-1}$ $$G \triangleq H_p^{-1}$$

Define G as the inverse of the parity portion of the parity check matrix.

8) $p = sG^T$

In FIG. 9, the calculations of Phase 1 may be implemented as a binary vector-matrix multiplication of the user portion u and a low density parity check matrix $H_u^T$. Here, according to one embodiment of the present invention, the calculation of Phase I involves calculating a partial syndrome s, shown in FIG. 9 as $$s \triangleq uH_u^T.$$

The generation of the low density parity check matrix $H_u^T$, can follow conventional or otherwise known practices. Low density parity check (LDPC) coding, was first proposed in the 1960s, but was not used until the late 1990s when researchers began to investigate iterative coding and decoding techniques. LDPC codes are among the few known error control coding techniques capable of transmitting information at a rate close to the Shannon limit or channel-capacity.

In general, LDPC codes can be decoded in a myriad of ways, ranging in complexity and error performance.

An LDPC encoder (such as LDPC encoder 900) may be implemented using linear or cyclic shift registers, in which the results of the LDPC encoder block matrix-vector multiplication may be accumulated in a memory buffer (such as page buffer 250 shown in FIG. 2) at each calculation step. In particular, the encoding algorithm may be implemented on data processing circuitry, such as a field-programmable gate array (FPGA) or application specific integrated circuit (ASIC) which may be part of control component 120 or control circuit 220 or control 5a in host 5. Accordingly, LDPC encoders are programmable, making it relatively easy to change encoding parameters, such as block length or code rate, without having to re-design (or re-build) the LPDC encoders.

Figure 10:
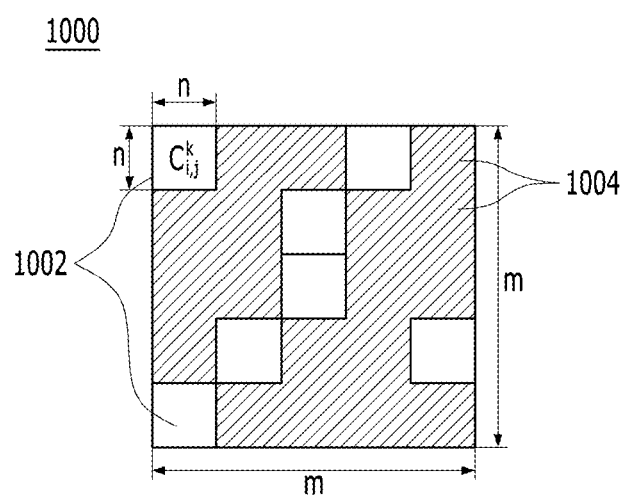
FIG. 10 is a schematic depicting a structure of a square matrix $G^T$ usable in one embodiment of the present invention.

The partial syndrome as shown in FIG. 9 is output from Phase I and provided to Phase 2 of the encoder 900. According to one embodiment of the present invention, the calculation of Phase 2 (calculating the parity portion of the codeword) involves the matrix $G^T$ being both 1) the inverse of the low density parity matrix $H_u^T$, and 2) a quasi-cyclic matrix as shown in FIG. 10. In LDPC encoder 900, the user portion of the codeword u is the input, and the complete codeword c is the output. The encoder calculates the parity portion of the codeword p, and concatenate u and p to form the completed codeword c=[u, p].

For example, user portion containing data information may correspond to (0 0 1 1 0) and the parity may correspond to (1 1 0 1 1), which when concatenated would be transmitted as (0 0 1 1 0 1 1 1 1), thereby containing both user data and parity information for transmission. A modulator at the source of the data such as at memory system 10 (shown in FIG. 1) would input the complete codeword, generate a modulated broadcast signal showing for example the pattern of (0 0 1 1 0 1 1 0 1 1), and transmit the modulated signal to a receiver at host 5. The present invention is not so limited to the transmission of data only between memory devices, but can be used in other fields where binary data is being transmitted from point A to point B.

FIG. 10 is a schematic depicting a structure of quasi-cyclic matrix $G^T$ 1000. $G^T$ is a m×m square matrix consisting of circulant matrices $C_{i,j}^k$ 1002 of size n×n. A slot is one area of the matrix $G^T$ 1000 that could be filled by the circulant matrices 200. The blur areas 1004 in FIG. 10 represent areas of the matrix 1000 which have all zero values.

$$\frac{m}{n}$$

is both the number of horizontal slots and the number of vertical slots in quasi-cyclic matrix $G^T$ 1000 that can be filled with the circulant matrices. In total, there are $$\frac{m^2}{n^2}$$

slots in quasi-cyclic matrix $G^T$. Not all slots are occupied by a circulant matrix 1002.

The circulant matrix $C_{i,j}^k$ permits a circular shift of an identity matrix. In the circulant matrix $C_{i,j}^k$, i represents the horizontal slot index, j represents the vertical slot index, and k represents the circular right-shift amount. For example, if k=0, $C^0$ is the identity matrix. If the size of C is 3×3 matrix, $C^1$ is shown in FIG. 11.

Figure 11:
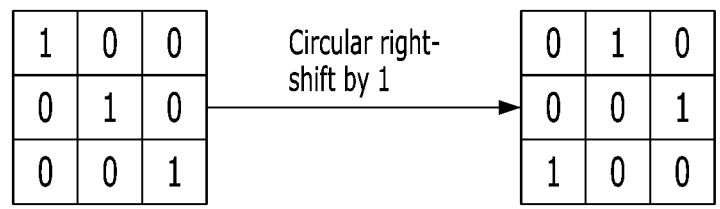
FIG. 11 is a depiction of a 3×3, $C^1$ circulant matrix usable in one embodiment of the present invention.

More specifically, FIG. 11 is a depiction of a 3×3 $C^1$ circulant matrix showing a circular right shift by 1 (k=1) where the "1" entries in the left side depiction are shifted one entry (k=1) to the right in the right side depiction.

Figure 12:
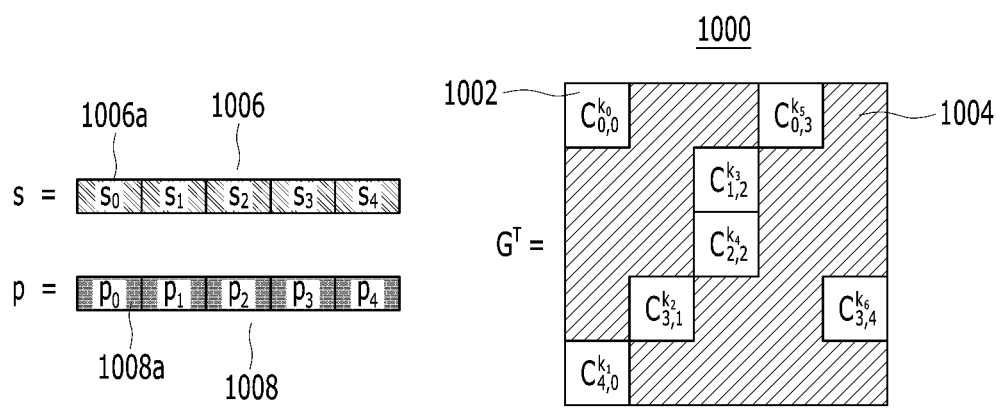
FIG. 12 is a depiction of exemplary structures $G^T$, s, and p in a 5 bit parity example.

FIG. 12 is a depiction of a depiction of exemplary structures $G^T$, s, and p in an example having a 5 bit parity matrix p and a 5 bit syndrome matrix s as vector matrices. More specifically, the structures of $G^T$ 1000, s 1006, and p 1008 are shown for the example where $$\frac{m}{n} = 5.$$

Similar to quasi-cyclic matrix $G^T$, the partial syndrome s 1006 calculated from Phase 1 is split into $$\frac{m}{n}$$

segments 1006a (the segments 1006a having a length n), and the parity portion p 1008 of the codeword is split into $$\frac{m}{n}$$

segments 1008a (the segments 1008a also having a length n). The present inventors have discovered that by leveraging the segmented structure of $G^T$, s and p, in one embodiment of the present invention, the calculation $p=sG^T$, in Phase 2 of encoder 900, can be broken down into processing the segments (for example by parallel processing) and produce the parity portions without the matrix multiplication of s and $G^T$ for the calculation of the parity portions.

Figure 13:
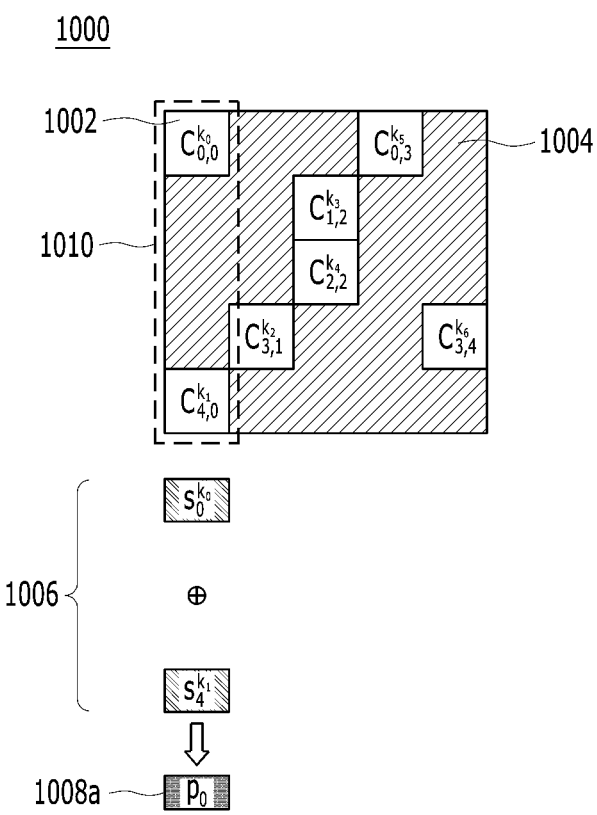
FIG. 13 is a depiction of a columnar calculation of a parity bit, according to one embodiment of the present invention.

FIG. 13 is a depiction of a columnar calculation of a parity bit. While $$\frac{m}{n}$$

can be any positive values, $$\frac{m}{n} = 5$$

is used here as an example to describe the calculation steps in this embodiment of the invention. As shown in FIG. 13, to calculate the first segment $p_0$, the first parity portion 1008a of the LDPC codeword c, the first circulant column 1010 (j=0) of $G^T$ is analyzed. In this example, there are two non-zero circulant matrices 1002 at $C_{0,0}^{k_0}$ and $C_{4,0}^{k_1}$. Thus, $s_0$ and $s_4$ are read from the first and fourth segments of s calculated in Phase 1. A circular right-shift of $s_0$ in the $G^T$ matrix 1000 by $k_0$ obtains $s_0^{k_0}$ (one partial syndrome value for the Phase 2 calculation), and a circulant right-shift of $s_4$ by $k_1$ in the $G^T$ matrix 1000 by $k_1$ obtains $s_4^{k_1}$ (another partial syndrome value for the Phase 2 calculation). Then $p_0=s_0^{k_0}$ XOR $s_4^{k_1}$. FIG. 13 shows an example of the calculation of $p_0$, where the symbol ⊕ represents an XOR operation.

Figure 14:
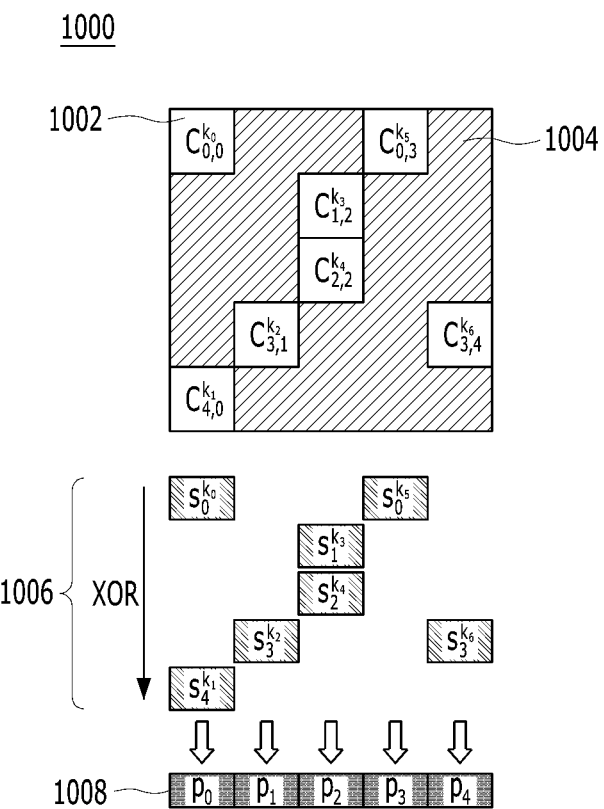
FIG. 14 is a depiction of parallel processing of the columnar calculations in FIG. 13.

In one embodiment of the present invention, the segments of p can be calculated simultaneously using similar calculations as above for $p_0$. FIG. 14 shows the calculation steps of all segments in this $$\frac{m}{n} = 5$$

example. Once all segments are calculated, the codeword c may be formed by concatenating the user portion(s) of the LDPC codeword and the parity portion(s) of the LDPC codeword.

Since matrix multiplication for calculation of $p_0$ is not required for $p=sG^T$, in this embodiment of the invention, $G^T$ does not need to be represented by a matrix. For each segment or portion of p to be calculated, only the indices of the selected s segments and corresponding shift values k for each selected s segment are needed. This greatly reduces the size required to store $G^T$ and computational complexity in calculating the parity.

Figure 15:
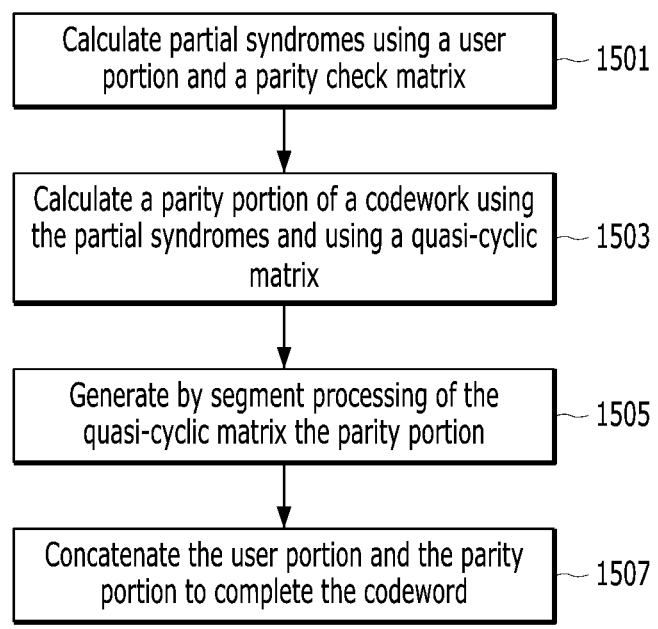
FIG. 15 is a flowchart illustrating an operation for LDPC encoding in accordance with one embodiment of the present invention.

FIG. 15 is a flowchart illustrating the operation for LDPC encoding in accordance with one embodiment of the present invention. As shown in FIG. 15, at 1501, partial syndromes using a user portion and a low density parity check matrix are calculated. At 1503, a parity portion of a codeword is calculated using the partial syndromes and using a quasi-cyclic matrix. At 1505, the parity portion is generated by segment processing of the quasi-cyclic matrix. At 1507, the user portion and the parity portion are concatenated to complete the codeword.

Here in this operation for LDPC encoding, the parity portion can be calculated by: a) segmenting the quasi-cyclic matrix into multiple segments, b) performing an exclusive OR (XOR) operation on partial syndrome values corresponding to each of the multiple segments to generate respective parity portion segments, and c) generating the parity portion from the parity portion segments corresponding to the multiple segments.

Here in this operation for LDPC encoding, the quasi-cyclic matrix can be a square matrix having a size of m×m including square circulant matrices having a size of n×n partially filling slots in the quasi-cyclic matrix. The segmenting the quasi-cyclic matrix into multiple segments may occur by segmenting the quasi-cyclic matrix into column or row segments. The segmented processing of the quasi-cyclic matrix may circular right-shift the square circulant matrices to obtain syndrome values corresponding respectively to each column or row entry of the column or row segments. The circular right shifting can shift entries of the square circulant matrices to the right by a value k. The columnar processing of the quasi-cyclic matrix can perform an exclusive OR (XOR) operation on the syndrome values to produce the parity portion.

The operation for LDPC encoding in accordance with other embodiments of the present invention can transmit the user portion containing data bit information and the parity portion from a source of the data bit information to a receiver. In one embodiment, the data bit information can reside in a solid state drive and the receiver can reside in a host device. At the receiver, the received data bit information can be decoded and the parity of the received data bit information can be verified.

In one embodiment of the present invention, LDPC encoder 900 may be incorporated into the error correction code (ECC) component 130 shown in FIG. 2 and may communicate via memory interface 150 to control circuit 220 and input/output 270 or may communicate via host interface 140 to host 5. Memory devices in the host or in memory system can store the parity check matrices associated with the LDPC codes. In various embodiments, different parity check matrices for different LDPC codes (e.g., of different correction capabilities, different sizes, different irregularities, etc.) may be stored and recalled as needed. In various embodiments, LDPC encoder 900 may control, among other things, a LDPC code profile, a code rate, a parity check matrix block length, a number of parity check matrix block rows, a number of parity check matrix block columns, a number of rows and columns for quasi-cyclic matrix 1000 and circulant matrix 1002.

In another embodiment of the present invention, LDPC encoder 900 shown in FIG. 9 can function as an LDPC decoder. In this case, the LDPC decoder is provided with the structure of matrix $G^T$ 1000 prior to decoding. The LDPC decoder receives a transmitted concatenated codeword containing data information u' and the parity information p. Since G is the inverse of the parity check matrix H, the LDPC decoder inverts G to arrive at H, and then uses vector multiplication the received codeword u' and H to calculate the subsequent syndrome information s'. The LDPC decoder may then use s' and G (as detailed in the operation of the LDPC encoder described above) to generate a new parity p'. If the syndrome information s and s' agree and/or the parity information p and p' agree, then there is confirmation that the transmitted codeword u and the received codeword u' are the same. If not conventional LDPC error correction techniques can be used to correct the transmitted codeword u'.

According to one embodiment of the present invention, there is provided a system for error code detection, having a data source and a controller configured to perform LDPC encoding of data bit information from the data source.

In this embodiment, the controller (such as control component 120 or control circuit 220 or control 5a in host 5) is programmed to: a) calculate partial syndromes using a user portion and a low density parity check matrix, b) calculate a parity portion of a codeword using the partial syndromes and using a quasi-cyclic matrix, c) generate by segment processing of the quasi-cyclic matrix the parity portion, and d) concatenate the user portion and the parity portion to complete the codeword. The controller can calculate the parity portion by: a) segmenting the quasi-cyclic matrix into multiple segments, b) performing an exclusive OR (XOR) operation on partial syndrome values corresponding to each of the multiple segments to generate respective parity portion segments, and c) generating the parity portion from the parity portion segments corresponding to the multiple segments. As before, the quasi-cyclic matrix can be a square matrix having a size of m×m including square circulant matrices having a size of n×n partially filling slots in the quasi-cyclic matrix.

The controller (such as control component 120 or control circuit 220 or control 5a in host 5) can segment the quasi-cyclic matrix into column or row segments. The controller can circular right-shift the square circulant matrices to obtain syndrome values corresponding respectively to each column or row entry of the column or row segments such as for example shifting entries of the square circulant matrices to the right by a value k. The controller can perform an exclusive OR (XOR) operation on the syndrome values to produce the parity portion.

In one embodiment of the present invention, the controller (such as control component 120 or control circuit 220 or control 5a in host 5) can be programmed to transmit the user portion containing the data bit information and the parity portion from a data base to a receiver. The data source may reside in a solid state drive (such as memory system 10) and the receiver may reside in a host device (such as host 5). In one embodiment of the present invention, the receiver can be programmed to decode the received data bit information and verify that the parity of the received data bit information is correct.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives of the disclosed embodiment. Furthermore, the disclosed embodiments may be combined to form additional embodiments.

Indeed, implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations, one or more features from a combination can in some cases be excised from the combination, and the combination may be directed to a sub-combination or variation of a sub-combination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. An LDPC encoding method for generating a codeword before transferring data from a first storage medium to a second storage medium, comprising:
    calculating partial syndromes using a user portion including the data and using a low density parity check matrix;
    calculating a parity portion of the codeword using the partial syndromes and a quasi-cyclic matrix having slots therein filled with at least one circulant matrix and other slots filled with all zero values, wherein the quasi-cyclic matrix $G^T$ satisfies $p=sG^T$, where the parity portions p are expressed as a parity vector and the partial syndromes s are expressed as a syndrome vector;

generating the parity portion without matrix multiplication of $sG^T$ by segment processing of at least one segment of the quasi-cyclic matrix having the at least one circulant matrix; and concatenating the user portion and the parity portion to complete the codeword, and transmitting the codeword completed without matrix multiplication of $sG^T$ to the second storage medium.

2. The method of claim 1, wherein the parity portion is calculated by:

segmenting the quasi-cyclic matrix into multiple segments having the at least one circulant matrix;

performing an exclusive OR (XOR) operation on partial syndrome values corresponding to each of the multiple segments to generate respective parity portion segments; and generating the parity portion from the parity portion segments corresponding to the multiple segments.

3. The method of claim 2, wherein the quasi-cyclic matrix comprises a square matrix having a size of m×m including square circulant matrices having a size of n×n partially filling slots in the quasi-cyclic matrix.

4. The method of claim 3, wherein the segmenting the quasi-cyclic matrix into multiple segments comprises segmenting the quasi-cyclic matrix into column or row segments.

5. The method of claim 4, wherein the segmented processing of the quasi-cyclic matrix comprises a circular right-shifting of the syndrome vector to obtain syndrome values corresponding respectively to each column or row entry of the column or row segments.

6. The method of claim 5, where the circular right shifting shifts entries of the syndrome vector to the right by a value k.

7. The method of claim 5, wherein the columnar processing of the quasi-cyclic matrix further comprises performing an exclusive OR (XOR) operation on the syndrome values to produce the parity portion.

8. The method of claim 1, further comprising transmitting the user portion containing data bit information and the parity portion from a source of the data bit information to a receiver.

9. The method of claim 8, wherein the data bit information resides in a solid state drive and the receiver resides in a host device.

10. The method of claim 9, further comprising at the receiver decoding the received data bit information and verifying that the parity of the received data bit information is correct.

11. A system for error code detection, comprising:
a data source comprising a first storage medium; and
a controller configured to perform LDPC encoding of data bit information from the data source and generate a codeword before transferring data from the first storage medium to a second storage medium, wherein the controller is programmed to:
calculate partial syndromes using a user portion including the data and using a low density parity check matrix,
calculate a parity portion of the codeword using the partial syndromes and using a quasi-cyclic matrix having slots therein filled with at least one circulant matrix and other slots filled with all zero values, wherein the quasi-cyclic matrix $G^T$ satisfies $p=sG^T$, where the parity portions p are expressed as a parity vector and the partial syndromes s are expressed as a syndrome vector,
generate the parity portion without matrix multiplication of $sG^T$ by segment processing of at least one segment of the quasi-cyclic matrix having the at least one circulant matrix, and
concatenate the user portion and the parity portion to complete the codeword, and transmit the codeword completed without matrix multiplication of $sG^T$ to the second storage medium.

12. The system of claim 11, wherein controller is configured to calculate the parity portion by:

segmenting the quasi-cyclic matrix into multiple segments having the at least one circulant matrix;

performing an exclusive OR (XOR) operation on partial syndrome values corresponding to each of the multiple segments to generate respective parity portion segments; and generating the parity portion from the parity portion segments corresponding to the multiple segments.

13. The system of claim 12, wherein the quasi-cyclic matrix comprises a square matrix having a size of m×m including square circulant matrices having a size of n×n partially filling slots in the quasi-cyclic matrix.

14. The system of claim 13, wherein the controller is programmed to segment the quasi-cyclic matrix into column or row segments.

15. The system of claim 14, wherein the controller is programmed to circular right-shift the syndrome vector to obtain syndrome values corresponding respectively to each column or row entry of the column or row segments.

16. The system of claim 15, where the circular right shifting by the controller shifts entries of the syndrome vector to the right by a value k.

17. The system of claim 15, wherein the controller is programmed to perform an exclusive OR (XOR) operation on the syndrome values to produce the parity portion.

18. The system of claim 11, wherein the controller is further programmed to transmit the user portion containing the data bit information and the parity portion from the data base to a receiver.

19. The system of claim 18, wherein the data source resides in a solid state drive and the receiver resides in a host device.

20. The system of claim 19, wherein the receiver is programmed to decode the received data bit information and verify that the parity of the received data bit information is correct.

* * * * *